United States Patent
Lazarus et al.

(10) Patent No.: US 10,104,805 B2
(45) Date of Patent: Oct. 16, 2018

(54) SELF COOLING STRETCHABLE ELECTRICAL CIRCUIT HAVING A CONDUIT FORMING AN ELECTRICAL COMPONENT AND CONTAINING ELECTRICALLY CONDUCTIVE LIQUID

(71) Applicants: Nathan S. Lazarus, Bethesda, MD (US); Christopher P. Migliaccio, Albuquerque, NM (US)

(72) Inventors: Nathan S. Lazarus, Bethesda, MD (US); Christopher P. Migliaccio, Albuquerque, NM (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 47 days.

(21) Appl. No.: 15/149,731

(22) Filed: May 9, 2016

(65) Prior Publication Data
US 2017/0325359 A1    Nov. 9, 2017

(51) Int. Cl.
H05K 7/20    (2006.01)
H05K 1/02    (2006.01)

(52) U.S. Cl.
CPC ....... H05K 7/20263 (2013.01); H05K 1/0283 (2013.01)

(58) Field of Classification Search
CPC . H05K 7/20263; H05K 7/20281; H04M 1/18; H04B 1/3888; H04B 1/3833; H04B 2001/3894
See application file for complete search history.

(56) References Cited

U.S. PATENT DOCUMENTS

| 4,180,922 A * | 1/1980 | Cieslak ............... A43B 7/02 126/206 |
| 4,577,175 A | 3/1986 | Burgher et al. |
| 5,101,086 A | 3/1992 | Dion et al. |
| 5,210,513 A | 5/1993 | Khan et al. |
| 5,462,685 A | 10/1995 | Raj et al. |
| 5,495,682 A * | 3/1996 | Chen ............... A43B 3/0005 219/211 |
| 5,800,490 A * | 9/1998 | Patz ............... A61F 7/007 607/108 |
| 6,222,733 B1 | 4/2001 | Gammenthaler |
| 6,278,353 B1 | 8/2001 | Downing et al. |

(Continued)

FOREIGN PATENT DOCUMENTS

WO    2012/050938 A2    4/2012

OTHER PUBLICATIONS

Asuncion V. Lemoff and Abraham P. Lee, "An AC magnetohydrodynamic micropump," Sensors and Actuators B 63 (2000) 178-185.

(Continued)

*Primary Examiner* — Mukund G Patel
(74) *Attorney, Agent, or Firm* — Eric Brett Compton

(57) ABSTRACT

Self-cooling stretchable electrical circuits with a conduit forming an electrical component and containing electrically conductive liquid are disclosed. They are formed of a platform made of a stretchable material. At least one fluid conduit is formed in the platform and the conduit is formed into an electrical component and filled with the electrically conductive liquid metal. A portion of the conduit is positioned adjacent a heat sink while a pump circulates the liquid through the conduit wherein the metal is cooled at the heat sink.

24 Claims, 5 Drawing Sheets

(56) References Cited

U.S. PATENT DOCUMENTS

| | | | |
|---|---|---|---|
| 6,278,354 B1 | 8/2001 | Booth | |
| 6,700,052 B2* | 3/2004 | Bell | H01L 35/32 |
| | | | 136/201 |
| 7,477,123 B2 | 1/2009 | Beerling | |
| 7,539,016 B2* | 5/2009 | Sauciuc | F28D 15/0266 |
| | | | 257/714 |
| 8,087,254 B2* | 1/2012 | Arnold | A41D 13/005 |
| | | | 62/3.2 |
| 9,099,237 B2 | 8/2015 | Balcerak et al. | |
| 9,226,402 B2* | 12/2015 | Hsu | H05K 1/189 |
| 9,427,041 B2* | 8/2016 | Lupinek | A43B 7/34 |
| 9,572,393 B2* | 2/2017 | Krupenkin | A43B 7/02 |
| 2004/0133135 A1* | 7/2004 | Diana | A61H 9/0078 |
| | | | 601/152 |
| 2007/0215663 A1* | 9/2007 | Chongson | A45C 1/04 |
| | | | 224/650 |
| 2009/0277498 A1* | 11/2009 | Angel | C03B 23/0256 |
| | | | 136/246 |
| 2010/0071883 A1 | 3/2010 | Vetrovec | |
| 2010/0095762 A1* | 4/2010 | Despesse | H01Q 1/243 |
| | | | 73/290 V |
| 2012/0007778 A1* | 1/2012 | Duwel | H01Q 3/446 |
| | | | 342/368 |
| 2013/0085552 A1* | 4/2013 | Mandel | A61F 7/007 |
| | | | 607/99 |
| 2014/0077656 A1* | 3/2014 | Thramann | H02N 11/008 |
| | | | 310/308 |
| 2014/0168022 A1 | 6/2014 | Cetiner et al. | |
| 2015/0029658 A1* | 1/2015 | Yairi | G06F 1/20 |
| | | | 361/679.47 |
| 2015/0289410 A1* | 10/2015 | Salat | H01L 23/473 |
| | | | 361/699 |
| 2015/0351216 A1* | 12/2015 | Loewen | H05K 7/20272 |
| | | | 361/696 |

OTHER PUBLICATIONS

S. P. Lacour, S. Wagner, Z. Huang, and Z. Suo, "Stretchable gold conductors on elastomeric substrates," Applied Physics Letters, vol. 82, No. 15, Apr. 2003, 2404-2406.

D. S. Gray, J. Tien, and C. S. Chen, "High-conductivity elastomeric electronics," Adv. Mater. 2004, 16, No. 5, Mar. 5, pp. 393-397.

A. Miner and U. Ghosal, "Cooling of high-power-density microdevices using liquid metal coolants," Appl. Phys. Lett. vol. 85, No. 13, Jul. 19, 2004, 506-508.

Kamran Mohseni, "Effective Cooling of Integrated Circuits Using Liquid Alloy Electrowetting," Proc. Semi-Therm 2005 Symposium.

J. Engel, J. Chen, N. Chen, S. Pandya, and C. Liu, "Multi-walled carbon nanotube filled conductive elastomers: Materials and Application to Micro transducers," Proc. MEMS 2006, pp. 246-249.

Kun-Quan Ma and Jing Liu, "Heat-driven liquid metal cooling device for thermal management of a computer chip," J. Phys. D: Appl. Phys. 40 (2007) 4722-4729.

H. Kim, T. Maleki, P. Wei, and B. Ziaie, "A biaxial stretchable interconnect with liquid alloy-covered joints on elastomeric substrate," J. Microelectromech. Syst., vol. 18, No. 1, Feb. 2009 pp. 138-146.

J. Vetrovec, D. A. Copeland, R. Feeler, and J. Junghans, "Testing of an Active Heat Sink for Advanced High-Power Laser Diodes," Proc. SPIE, vol. 7918, 79180G, 2011.

D. Kim et al., "Epidermal Electronics," Science, vol. 333, Aug. 2011, pp. 838-843.

M. Hodes, R. Zhang, R. Wilcoxon, and N. Lower, "On the Coiling Potential of Galinstan-Based Minichannel Heat Sinks," IEEE Trans. Components, Packaging and Manufacturing Technology, vol. 4, No. 1, 2014, pp. 46-56.

C. Keplinger, J. Sun, C. C. Foo, P. Rothemund, G. M. Whitesides, and Z. Suo, "Stretchable transparent ionic conductors," Science, vol. 341, Aug. 2013 pp. 984-987.

Lazarus, N.; Meyer, C. D.; Bedair, S. S.; Nochetto, H.; Kierzewski, I. M. "Multilayer Liquid Metal Stretchable Inductors," Smart Mater. Struct. 2014, 23, 085036.

A. Fassler and C. Majidi, "Liquid-Phase Metal Inclusions for a Conductive Polymer Composite," Adv. Mater. 2015, 27, 1928-1932.

U.S. Appl. No. 15/144,995, filed May 3, 2016 titled "Deformable Inductive Devices Having a Magnetic Core Formed of an Elastomer With Magnetic Particles Therein Along With a Deformable Electrode".

* cited by examiner

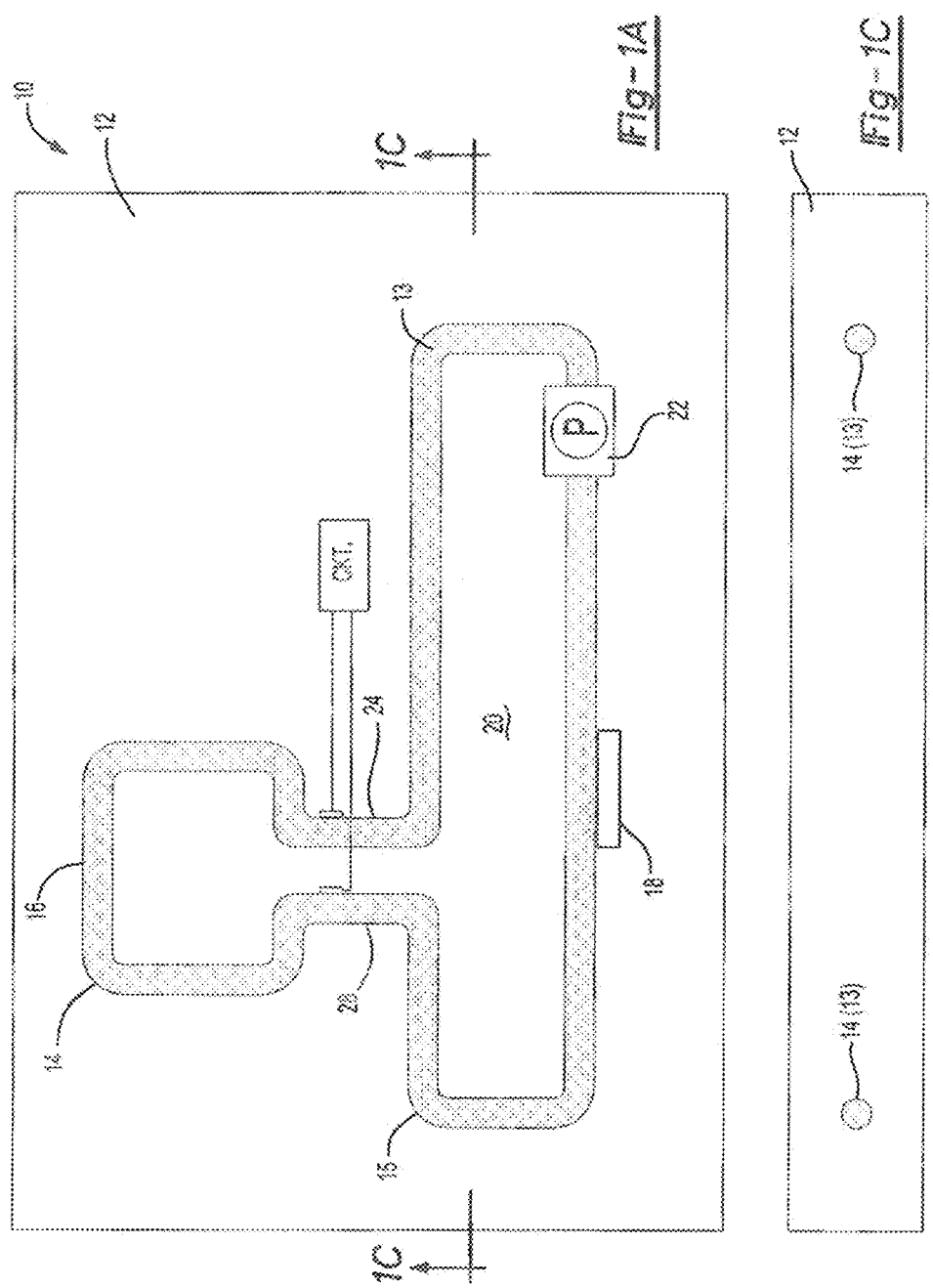

SELF COOLING STRETCHABLE ELECTRICAL CIRCUIT HAVING A CONDUIT FORMING AN ELECTRICAL COMPONENT AND CONTAINING ELECTRICALLY CONDUCTIVE LIQUID

GOVERNMENT INTEREST

The invention described herein may be manufactured, used, and licensed by or for the United States Government.

BACKGROUND OF THE INVENTION

I. Field of the Invention

The present invention relates to electronic devices, and more particular to self-cooling stretchable electrical circuits having a conduit forming an electrical component and containing electrically conductive liquid.

II. Description of Related Art

In recent years, a great deal of research and commercial interest has been focused on the area of stretchable electronics, i.e. electronics able to match and deform to surfaces such as human skin or clothing. These systems typically consist of stretchable conductors based on alternative materials, such as thin, wavy traces, conductive polymers, or liquid metals.

Most of the known practical applications have been focused on low power sensing of bioindicators. However, there is an increasing interest in creating higher power systems for computing or embedded actuators in clothing or placed on or near the skin to increase muscle strength or endurance.

One major disadvantage of these applications, however, is that the devices are generally thermally isolated and are typically attached to or in close proximity to the skin of a human. As such, the devices making use of significant amounts of electrical power are impractical while using current technologies in view of the amount of heat generated in operation. Such heat generated by the stretchable electronics can create excessive discomfort for the person wearing the electronics.

There have been previously known stretchable electronics which utilized liquid metal traces to form the electrical component. The electrical component is typically one or more loops forming an electrical inductor. In these devices, fluid channels are filled with liquid metals, such as galinstan (i.e., a common name for an eutectic alloy of gallium, indium and tin) or eutectic gallium indium, to form the conductive material for the inductors. Since millimeter scale cross sections can be achieved without losing the ability to stretch, unlike the wavy traces of other stretchable electronics, the use of fluid channels is particularly well-suited for applications that require very low resistance, such as power applications. However, such power applications necessarily increase the amount of heat generation.

SUMMARY OF THE INVENTION

The present invention provides self-cooling stretchable electrical circuits which overcome the aforementioned disadvantages.

In brief, a self-cooling stretchable electrical circuit according to embodiments of the present invention comprises a platform made of a stretchable material. The stretchable material may be formed from a variety of materials, such as polymers, silicone polymers, urethane, rubber latex, etc. These materials, furthermore, are also elastic thus returning to their original shape when released.

At least one fluid conduit is formed in the platform. The conduit (or at least a portion of it) forms an electrical component and is filled with an electrically conductive liquid. For example, the fluid conduit may be formed into one or more coils so that, when filled with a liquid metal, the conduit forms and function as an electrical inductor.

A wide variety of liquids may be used to fill the conduits, such as liquid metals and electrolyte fluids. In practice, eutectic gallium indium as well as other gallium alloys have proven best-suited as the liquid metal.

The electrical circuit also includes a heat sink arranged so that a portion of the conduit is positioned adjacent the heat sink. A pump then circulates the electrically conductive liquid, either continuously or discontinuously (e.g., in drops), through the conduit so that the heated liquid from the electrical component thermally couples with the heat sink so that the heat sink dissipates the heat from the liquid.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which:

FIGS. 1A and 1B illustrate top internal views of circuits having a self-cooling electrical component according to embodiments of the present invention. FIG. 1C shows an internal view looking in from the side along line 1C-1C in FIG. 1A;

DETAILED DESCRIPTION THE INVENTION

Figure 1B:
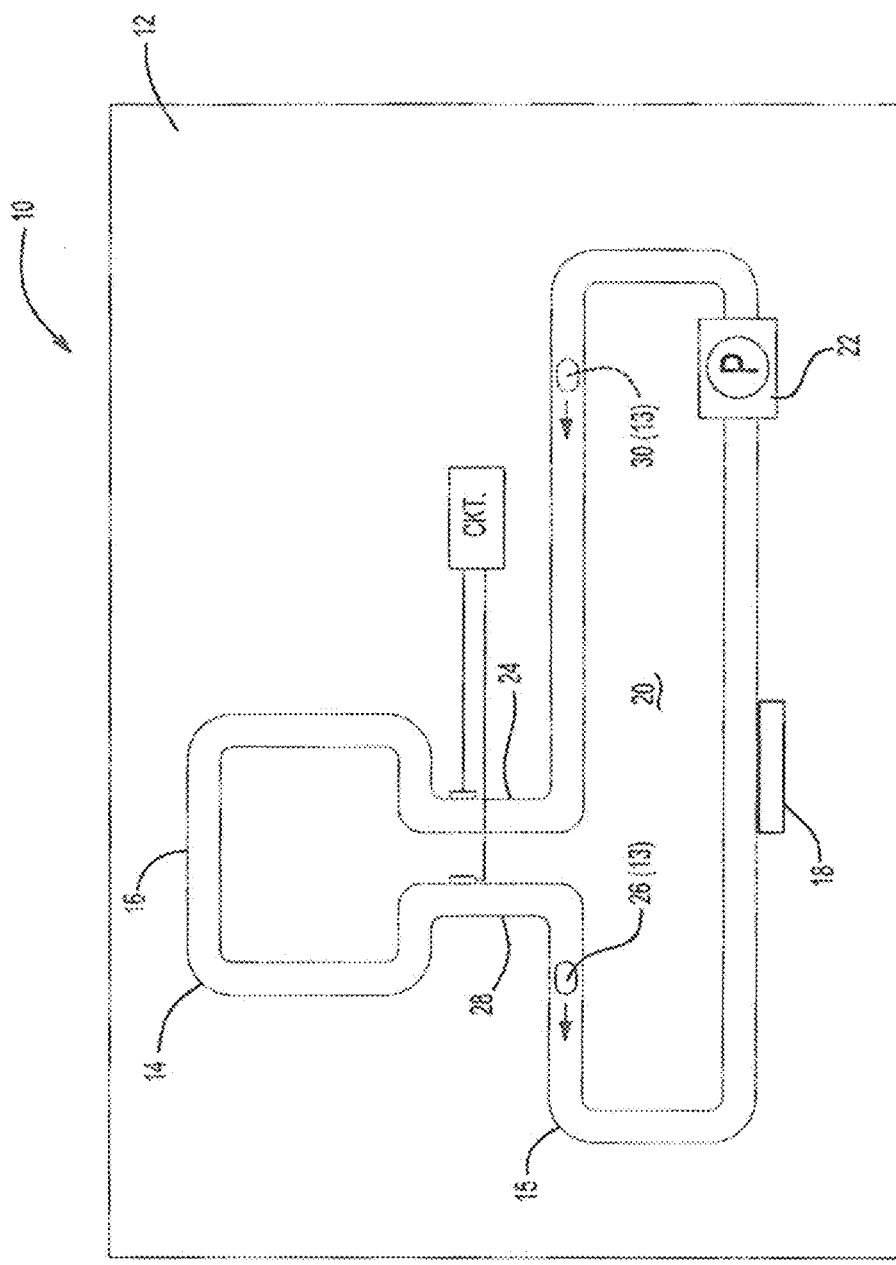

FIGS. 1A and 1B each show a top internal view of a self-cooling stretchable electrical circuit 10 according to embodiments of the present invention. FIG. 1C shows in an internal view looking in from the side along line 1C-1C in FIG. 1A. The circuit of FIG. 1B has a similar internal side view but is not shown in drawings.

The circuits depicted in these two figures are essentially identical, except for continuous vs. discontinuous liquid in the fluid conduit as further discussed below. The electrical circuit 10 includes a platform 12 which is adapted to be attached to a movable or deformable surface. Such a surface may include, for example, human skin, clothing, and the like. The platform 12 may be a planar element of a generally flat cross-section and thin height which may be rectangular in shape as shown; although, it will be appreciated that other shapes are possible.

The platform 12 may be constructed of any flexible, stretchable and/or elastic material which is readily capable of being stretched. For example, the platform 12 can be constructed of various polymer material, such as a urethane or silicone polymer, or a rubber latex. Still other materials may be used to form the platform 12 without deviation from the spirit or scope of the invention. The precise definition of a "stretchable" electronic device can vary, but more than about 5% strain tends to be the rough boundary between flexible and stretchable. In terms of applications, 30% is what is believed to be needed to match human skin over most of the body, 100% is the extreme at certain joints. The degree of which is dependent of the actual elastomers. (For instance, according to its datasheet, Ecoflex® Supersoft Silicon Product 00-30 is capable of stretching to 900% strain).

At least one elongated conduit 14 is formed in the platform 12. The conduit 14 would not ordinarily be visible from either the top or side perspectives in these or other embodiments, as it is an internal structure of the platform 12.

More particularly, at least one segment of the conduit 14 forms an electrical component, such as a coil 16. The at least one segment of the conduit 14 thus, not only has the physical shape or geometry of the electrical component, but is functionally operational as that electrical component. In this embodiment, the coil 16 forms an inductor coil for the electrical circuit 10. That is, the coil 16 is configured to produce a time-varying magnetic field when current flow through the inductor and/or to induce current flow in the presence of a changing magnetic field. Furthermore, although only a single coil 16 is shown in FIG. 1, it will be understood that the electrical inductor may be formed of multiple coils 16.

Because the coil 16 and the rest of the elongated conduit are electrically connected in parallel with one another, the reciprocal of the equivalent inductance of the circuit is equal to the sum of all the reciprocal values of the individual inductances. For two inductors having inductances of $L_1$ and $L_2$ connected in parallel, the equivalent inductance $L_{Eq}$ is found according to the equation (1) as follows:

$$\frac{1}{L_{Eq}} = \frac{1}{L_1} + \frac{1}{L_2}.$$

Since the coil 16 has a smaller length of trace (and/or encloses a smaller area) than the portion 20 of the elongated conduit 14, it will provide the dominant inductance of the circuit. Of course, other electrical components/configurations will provide different electrical responses for the circuit. For instance, if the same two inductors are alternatively connected in series, the equivalent inductance of the circuit would be equal to the sum of the individual inductances according to equation (2) as follows: $L_{Eq}=L_1+L_2$.

The fluid conduit 14 forms a fluid loop 15 in the platform 12 so that a portion of the conduit 14 passes in close proximity to a heat sink 18. The heat sink 18 may be constructed of any appropriate material with high heat conductivity, e.g. copper or aluminum, and is positioned sufficiently close to the portion 20 of the conduit 14 so that heat from the conduit portion 20 is transferred to the heat sink 18.

An electrically conductive liquid 13 is contained in the conduit 14. The electrically conductive liquid 13 replaces conventional solid conductors, such as wires and traces, typically made of copper or gold. As shown in FIG. 1A, the conductive liquid 13 is continuous and substantially fills the entire conduit 14. On the other hand, as shown in FIG. 1B, the liquid 13 can also be discontinuous with one or more separate portions, such as drops or droplets, two of which depicted as 26 and 30. The discontinuous liquid structure is electrically simpler (for instance, an inductor can be made in isolation without the additional inductance in parallel due to the return loop), but the continuous loop is easier to implement (since it removes the need to break off individual droplets and separately move them around).

The electrically conductive liquid metal may be a liquid metal or an electrolytic or ionic solution. Exemplary liquid metals can include mercury, galinstan, an eutectic gallium indium or gallium alloy, to name a few. Of course, various other liquid metals may be used to fill the inductor coil 16. An electrolytic or ionic solution can include fluid solutions with dissolved salt(s). An aqueous NaCl solution (salt water), for instance, is electrically conductive although much less so compared to the liquid metals. Nonetheless, it may be suitable for many applications. Fluid solutions of ethylene glycol, propylene glycerin, and glycol with the ionic conductors or electrolytes can also be used.

The conduit 14 may be integrally formed when fabrication the platform 12. For example, in some embodiments, the platform 12 may be three-dimensional (3-D) printed with voids, recesses and/or channels which will later form the conduit 14. Alternatively, the platform 12 could be formed in multiple pieces having voids, recesses or channels which when later joined together will form the conduit 14. The voids, recesses or channel could be formed in one or more of the platform pieces when they are fabricated or they might be later machined therein afterward. The platform pieces could be molded and the bonded together. An example of this technique is disclosed in N. Lazarus, C. D. Meyer, S. S. Bedair, H. Nochetto and I. M. Kierzewski, "Multilayer liquid metal stretchable inductors," Smart Mater. Struct. 23 (2014) 085036 (10 pp), herein incorporated by reference in its entirety. In particular, reference is made to FIGS. 3 and 4 and their descriptions in Section 3 of that article showing and discussing molding which may be used for fabricating the platform 12 with the integrally formed conduit(s).

Thus, by the one or more conduits 14 being formed 'in' the platform 12, the platform material itself should be thought of as basically forming and defining the conduits 14. For instance, that means that the platform material substantially surrounds a void (or voids) of material therein which ultimately form the one or more conduits 14 in the final device. This would be in contrast to separately forming a discrete or free-standing fluid conduit and subsequently joining it onto a surface of the stretchable substrate such as with a glue or adhesive. Of course, this should not preclude any embodiments in which pieces of the platform 12 having channels, recesses, and/or voids are formed and later joined together to form the overall platform in which the channels, recesses, or voids internally form the fluid conduit.

Following any of the aforementioned fabrication techniques, the self-cooling electrical devices may be sized for use as small electrical devices and sensors on the order of only a few centimeters and include 1-2 mm conduits and traces having a width of about 200 μm. These values are merely exemplary and may be larger or smaller depending on the desired application. This small size may be suitable for forming small electrical devices and sensor which can be applied on or near to the skin. For instance, see D. Kim et al., "Epidermal Electronics," Science, vol. 333, August 2011, pp. 838-843, herein incorporated by reference in its entirety, for exemplary small skin mounted electronics. When an electrical device is to be in direct contact with or close proximity to the skin, the maximum allowable device operating temperature may assumed to be 35° C. An increase of as little as 1-2° C., however, may cause discomfort to the wearer.

Thus, in order to transfer heat from the coil 16 and to the heat sink 18, a pump 22 is used to circulate the electrically conductive liquid 13 (as in FIG. 1A) or drops 28, 30 of liquid 13 (as in FIG. 1B) though the conduit 14. While the pump 22 may be located anywhere along the conduit 14, it may be positioned so as to create any area of pressure to one end 24 of the inductor coil 16. This pressure will cause a liquid drop 26 to flow out the other end 28 of the coil 16. This drop 26 is then forced through the conduit 14, past the heat sink 18, and ultimately returned as a now cooled droplet 30 back to the end 24 of the inductor coil 16. A suitable controller may be used to control the operational parameters of the pump 22, and in particular, the pressure and/or flow rate. (Examples of varying the flow rate and the effect on the operational current of an inductor device are further discussed below with respect to FIGS. 6 and 7).

A pumping means, i.e., pump 22, may be used to move liquid 13 through the conduit 14. The pump 22 can apply force to the end 24 of the inductor coil 16 and thus flow the liquid 13 through the fluid loop 15. For example, a number of pump types, such as electro-wetting or a pneumatically actuated diaphragm, can form the pump 22 to create the circulation of the liquid through the fluid loop 15 thus cooling the inductor loop 16. In some embodiments, the pump 22 may form, include or otherwise incorporate the heat sink 18. Fins may be provided on the heat sink 18, in some instances, to improve thermal transfer with air. Alternatively or additionally, the heat sink 18 might couple with liquid-coolant based radiator to increase heat dissipation.

The coil 16 connects to a circuit CKT. The circuit CKT may be fabricated on the platform 12 or located elsewhere. The circuit CKT includes other electrical components and makes uses of the coil (or other electrical component) for a particular application, such as a stretchable sensor device. The circuit may be conventionally configured for the particular application in some implementations. Electrical contact to the electrically conductive liquid 13 may be achieved by using embedded rigid metal wiring, such as a copper wire poked into the silicone or an embedded plate of copper, in some embodiments. Since liquid metals themselves can also be used for interconnect, it is also possible to make electrical contact to another liquid metal trace (by, for instance, having a channel branch off from the main loop). This might be more desirable for a fully stretchable system, eliminating rigid wiring entirely.

Figure 2:
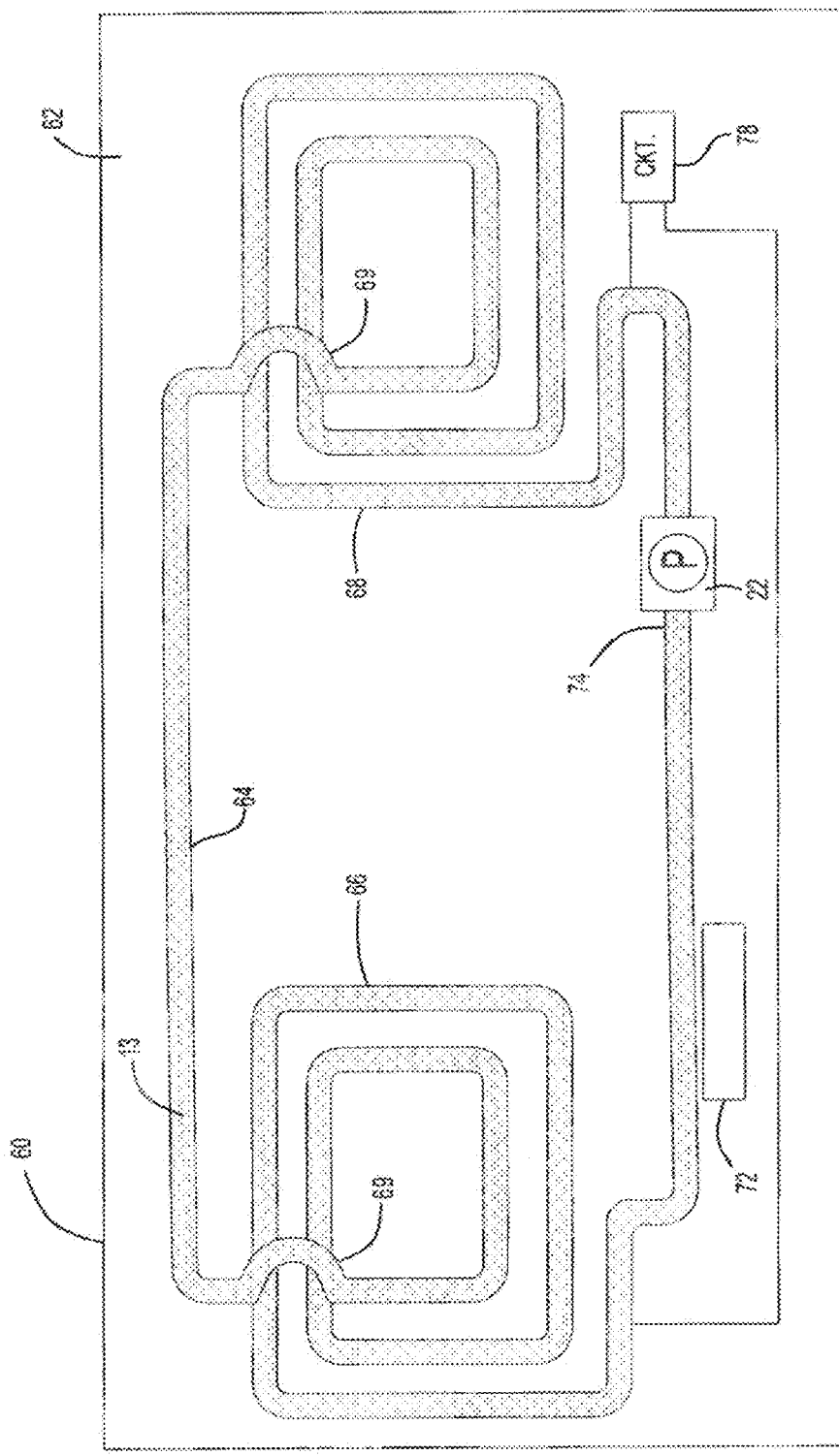
FIG. 2 is a diagrammatic view illustrating a self-cooling stretchable electrical circuit including two inductor coils according to an embodiment of the invention.

With reference now to FIG. 2, a self-cooling stretchable electrical circuit 60 having two inductor coils is shown. As before, the circuit 60 includes a thin platform 62 adapted to be attached to a surface subject to distortion, such as human skin, clothing, and the like. The platform 62 is stretchable and preferably elastic and may be made of a plurality of different materials, for example, urethane, silicone polymer, other polymers, rubber latex, and the like.

An elongated continuous conduit 64 which forms the fluid loop 15 is formed through the platform 62. At least one, and preferably two or more segments of the conduit 64 are formed into two inductor coils 66 and 68. Furthermore, since the inductor coils 66 and 68 comprise multiple coils, the elongated conduit 64 may include one or more overpasses 69 which extend over the conduit 64 and optionally outside the platform 62 in order to complete the continuous fluid loop 15 for the fluid conduit 64. Two overpasses 69 are included here. As shown, the two fluidic inductor coils 66 and 68 here are electrically connected in parallel. For the two inductors 66 and 68 having inductances of $L_1$ and $L_2$, respectively, the equivalent inductance $L_{Eq}$ is found according to the equation (1). And when $L_1 = L_2$, then $L_{Eq}$ is simply equal to ½ $L_1$. This results in a half reduction in equivalent inductance for the circuit 60. Since there is now a continuous loop of liquid, the system can now be cooled by simply pumping the liquid 13 around the loop 15 past a heat sink 72.

The heat sink 72 is positioned closely adjacent a portion 74 of the fluid conduit 64. Furthermore, the portion 74 of the fluid conduit 64 is sufficiently close to the heat sink 72 so that the conduit portion 74 and heat sink 72 are thermally coupled. As such, heat from the conduit portion 74 will be transferred to the heat sink 72 and dissipated in the conventional fashion. Any conventional material with high thermal conductivity, such as copper or aluminum, may be used to form the heat sink 72, for instance.

Like the embodiment in FIG. 1A, in FIG. 2 the entire conduit 64 can be filled with an electrically conductive liquid 13, such as a liquid metal. The liquid metal, as before, may comprise mercury, galinstan, an eutectic gallium indium or gallium alloy, although other materials may alternately be used. Discontinuous fluid implementations like shown in FIG. 1B are also possible.

A pump 22 is disposed around a segment of the fluid conduit 64. Upon activation, the pump 22 pumps the electrically conductive liquid 13 through the fluid conduit 64, and thus through the fluid loop and around the inductor coils 66 and 68. In doing so, the liquid heated by the inductor coils 66 and 68 is pumped past the heat sink 72 which dissipates the heat from the liquid. The now cooled liquid is pumped back into the inductor coils 66 and 68 and the above process is continuously repeated.

In some embodiments, a magnetohydrodynamic pump may be used as pump 22 to circulate the electrically conductive fluid 13 (e.g., liquid metal) through the fluid loop and the inductor coils 66 and 68; although, it will be understood, of course, that other types of pumps may be used without deviation from the spirit or scope of the invention.

The embodiment of the electrical inductor of FIG. 2 may further include electrical circuit CKT 78 configured for a particular application, such as a stretchable sensor device. Electrical contact to conductive liquid inductor elements may be achieved by using embedded rigid metal wiring, such as a copper wire poked into the silicone or an embedded plate of copper. Since liquid metals themselves can also be used for interconnects, it is also possible to make electrical contact to another liquid metal trace (by, for instance, having a channel branch off from the main loop). The latter may be more desirable for a fully stretchable system which eliminates rigid wiring entirely.

Although the electrical component has been described as an inductor coil above, it will be understood, of course, that other electrical components, such as capacitors and resistors, may also be formed by varying the geometry of the fluid conduit.

Figure 3:
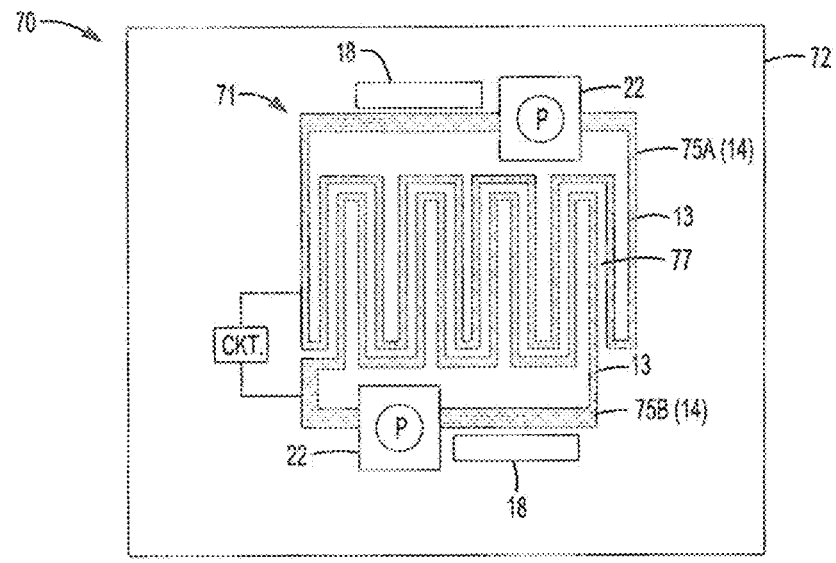
FIG. 3 is a diagrammatic view illustrating a self-cooling stretchable electrical circuit including capacitor according to an embodiment of the present invention.

FIG. 3 is a diagrammatic view illustrating a self-cooling stretchable electrical circuit 70 including a capacitor 71 according to an embodiment of the present invention. The circuit 70 includes a thin platform 72 adapted to be attached to a surface subject to distortion, such as human skin, clothing, and the like. The platform 72 can be made of the same platform material, as discussed above.

The capacitor may be composed of a pair of electrodes 75A, 75B which are spaced apart to provide a gap 77 that is configured so to generate an electrical field there between. The gap 77 may be filed with a conventional dielectric material. Each electrode 75 includes at least one conduit 14 containing an electrically conductive liquid 13. Pumps 22 circulates the liquid 13 through the respective conduits 14. And heat sinks 18 dissipate heat from the liquid 13. The capacitor may be used for electrical storage and/or filter purposes as any conventional capacitor, for instance. The capacitor 71 connects to a circuit CKT.

Figure 4:
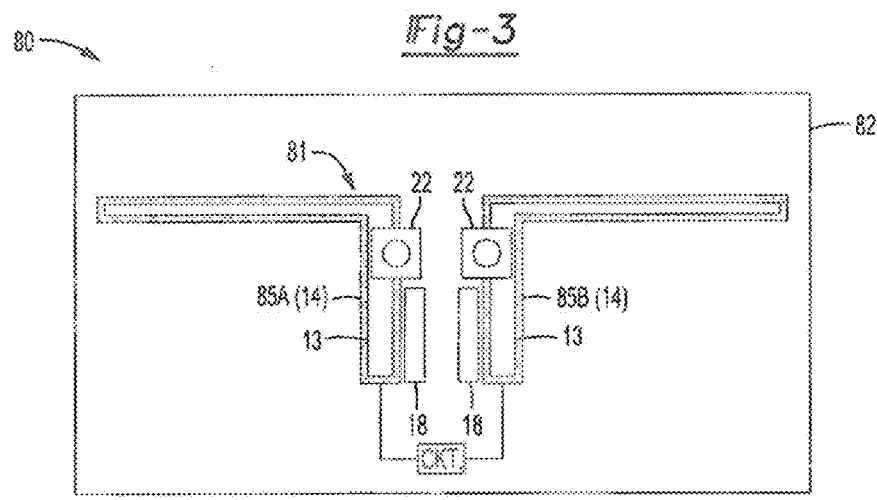
FIG. 4 is a diagrammatic view illustrating a self-cooling stretchable electrical circuit including an antenna according to an embodiment of the present invention.

FIG. 4 is a diagrammatic view illustrating a self-cooling stretchable electrical circuit 80 including an antenna 81 according to an embodiment of the present invention. The circuit 80 includes a thin platform 82 adapted to be attached to a surface subject to distortion, such as human skin, clothing, and the like. The platform 82 can be made of same platform material, as discussed above. The antenna 81 may be configured as a dipole antenna, for instance, as shown. The dipoles are composed of electrodes 85A, 85B with include at least one conduit 14 containing an electrically conductive liquid 13. Pumps 22 circulates the liquid 13 through the conduits 14. And heat sinks 18 dissipate heat from the liquid 13. The antenna 81 connects to a circuit CKT.

Figure 5:
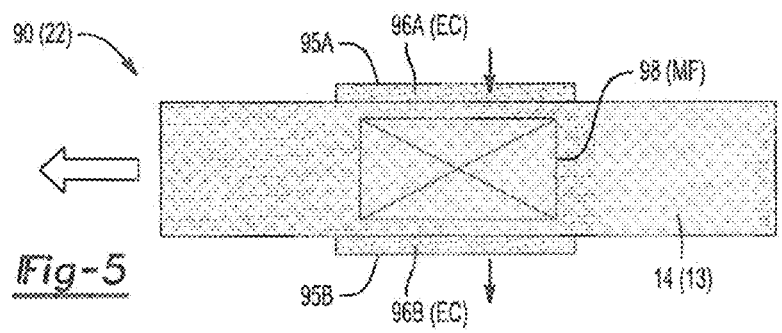
FIG. 5 shows a schematic of a magnetohydrodynamic pump which can be used for pumping electrically conductive liquid through conduits in a self-cooling stretchable electrical circuit according to an embodiment of the present invention.

FIG. 5 shows a schematic of a magnetohydrodynamic (MHD) pump 90 which can be used for pumping electrically conductive liquid 13 (or drops 26, 30) through conduits 14 according to an embodiment of the present invention. It thus can be used for the generic pump 22 discussed in the earlier embodiments. The MHD pump 90 is a type of non-moving actuated pump which uses a magnetic field as a means of propulsion. This effect can be used to move the liquid 13 through the conduit(s) 14 of the fluid loop 15 (in the direction of the arrow).

The pump 90 surrounds a portion of the fluid conduit 14. It is comprised of a pair of electrodes 95A, 95B positioned on opposing sides of the fluid conduit 14. As shown, the pair of electrodes 95A, 95B are located on upper and lower surfaces of the fluid conduit 14, but it will be appreciated that they could be located at other positions. The electrodes 95A, 95B may be copper plates, for instance. A magnet 90 is located adjacent to the fluid conduit 14 (e.g., behind the conduit 64 in the figure), and oriented such that its magnetic field is perpendicular to the electrodes 95. When an electrical current EC is applied across the conductive fluid, via electrodes 95A, 95B, fluid particles move between the two electrodes 95A, 95B.

When a moving charged fluid passes through a magnetic field MF, it experiences a force perpendicular to both the direction of motion F and the magnetic field MF. The result is flow perpendicular to both. This, in turn, generates a net force on the liquid and causes a propelling action of liquid through fluid loop 15.

The thermal behavior of a flow loop which might be used as an inductor has been modeled by the inventors. A very demanding application of this embodiment is a scenario where the stretchable inductor device is positioned in direct contact with the skin. In this case, the maximum allowable device temperature is assumed to be 35° C.; the precise value could be set by comfort considerations. To evaluate the efficacy of inducing fluidic motion in the liquid metal traces for device cooling, a two-dimensional model describing the self-cooling inductor was formulated using Comsol Multiphysics, a computational modeling software program.

The device dimensions and boundary conditions reflect recent work by the inventors. The channel had a rectangular cross-section with a length of 15 cm, width of 12 cm and a height of 2 mm. The electrically conductive fluid was assumed to be galinstan. At the inlet of the channel the temperature was 20° C. A coldplate (i.e., a heat sink) was located at the outlet. Its length was 25 mm. Channel walls were insulated to reflect the worst case scenario from a heat transfer perspective. The velocity of the liquid was varied as well as the current through the liquid. Current through the liquid creates heat via ohmic heating. By increasing the velocity of the liquid through the channel, greater heat transfer to the heat sink is possible.

Figure 6:
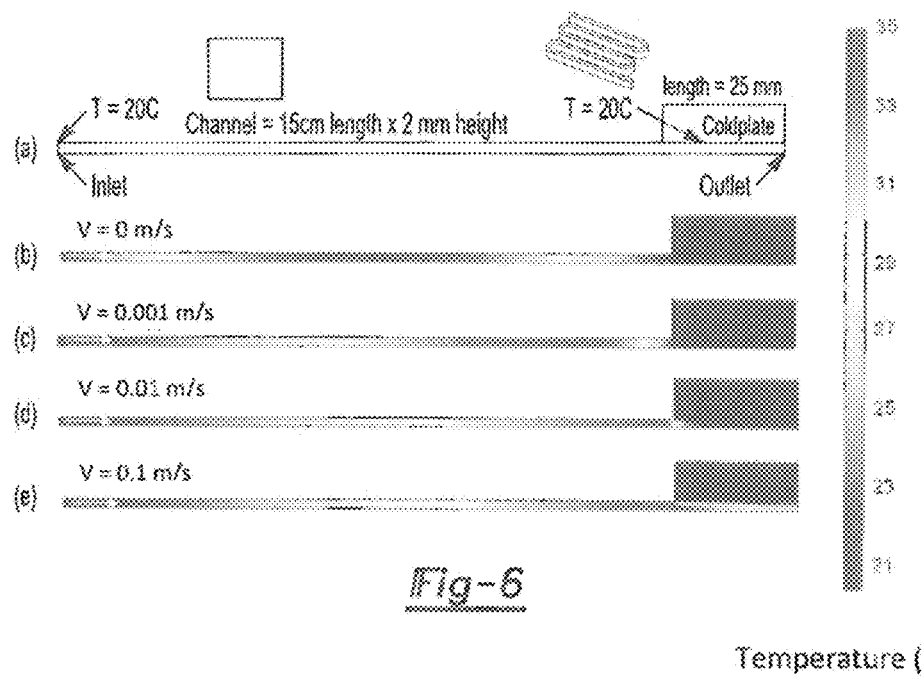
FIG. 6 shows the computational model of liquid metal inductor trace (a) under (b) no flow and (c-e) varied flow conditions.

FIG. 6 shows the computational model of liquid metal inductor trace (a) under (b) no flow and (c-e) varied velocity conditions. The device current is slowly increased for each velocity condition until the maximum allowable temperature of 35° C. is reached.

Figure 7:
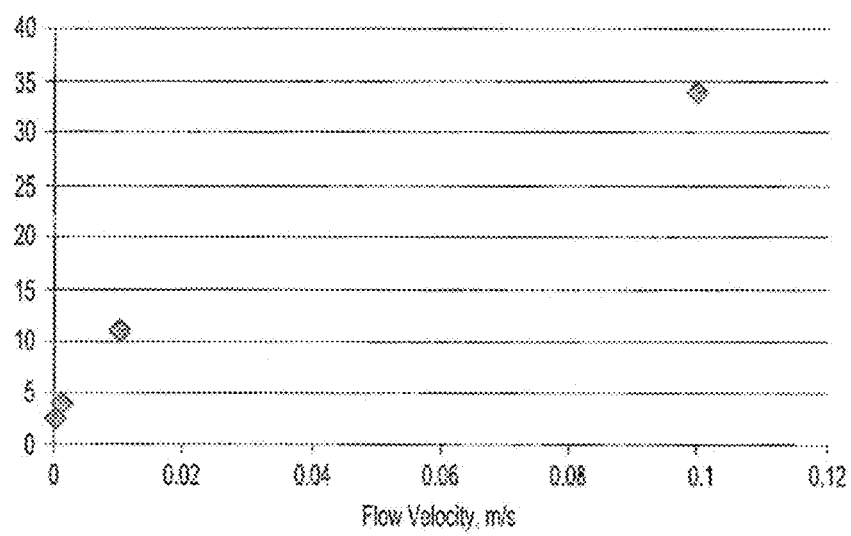
FIG. 7 is a plot showing the maximum allowable device current for varied liquid metal flow velocity.

FIG. 7 is a plot showing the maximum allowable device current for varied liquid metal flow velocity. Under no-flow condition (i.e., velocity of 0 m/s), the maximum allowable current is less than about 3 A. However, by inducing a flow velocity of just 0.1 m/s, the maximum current can be increased to 34 A. This results in nearly a 11× increase of the maximum current for the device.

From the foregoing, it can be seen that the present invention provides a unique electrical circuit, typically one or more inductors, which may be used in conjunction with a stretchable platform. Since the heat generated through the inductor coils is dissipated by the heat sink, heating discomfort for the wearer of the circuit is avoided.

Having described our invention, many modifications thereto will become apparent to those skilled in the art to which it pertains without deviation from the spirit of the invention as defined by the scope of the appended claims.

We claim:

1. A self-cooling stretchable electrical circuit comprising:
   a stretchable platform,
   at least one fluid conduit formed in said stretchable platform, said at least one fluid conduit forming an electrical component and containing an electrically conductive liquid,
   electrical contacts in said at least one fluid conduit which allow electricity to flow through the electrically conductive liquid as an electrical circuit,
   a heat sink, wherein at least a portion of said at least one fluid conduit is positioned adjacent said heat sink, and
   a pump which circulates said electrically conductive liquid through said at least one fluid conduit.

2. The electrical circuit as defined in claim 1, wherein said electrical component comprises at least one coil.

3. The electrical circuit as defined in claim 1, wherein said electrical component comprises an inductor, capacitor, resistor, transformer, or antenna.

4. The electrical circuit as defined in claim 1, wherein said stretchable platform is formed of an elastic or stretchable material.

5. The electrical circuit as defined in claim 4, wherein said elastic or stretchable material comprises a polymer or plastic.

6. The electrical circuit as defined in claim 5, wherein said polymer comprises a urethane or silicone polymer.

7. The electrical circuit as defined in claim 4, wherein said elastic or stretchable material comprises a rubber or latex.

8. The electrical circuit as defined in claim 1, wherein said stretchable platform is configured for attachment to skin or clothing.

9. The electrical circuit as defined in claim 1, wherein said electrically conductive liquid comprising a liquid metal or an electrolytic or ionic solution.

10. The electrical circuit as defined in claim 9, wherein said liquid metal comprises mercury, gallium indium, gallium alloy, or an eutectic alloy of gallium, indium and tin.

11. The electrical circuit as defined in claim 9, wherein said electrolytic or ionic solution comprises an aqueous salt solution.

12. The electrical circuit as defined in claim 1, wherein said pump forms, includes or otherwise incorporates the heat sink.

13. The electrical circuit as defined in claim 1, wherein said pump comprises a diaphragm which applies pressure to one end of said conduit.

14. The electrical circuit as defined in claim 13, wherein said diaphragm is pneumatically actuated.

15. The electrical circuit as defined in claim 1, wherein said pump comprises a magnetohydrodynamic pump.

16. The electrical circuit as defined in claim 1, wherein said pump circulates electrical drops of said liquid metal through said conduit.

17. The electrical circuit as defined in claim 1, wherein the flow rate of the pump is adjustably controlled.

18. The electrical circuit as defined in claim 1, wherein said stretchable platform material itself forms and defines the at least one conduit.

19. The electrical circuit as defined in claim 1, wherein said stretchable is formed of multiple pieces having at least one channel, recess, or void therein, which when the pieces are joined together to form the platform, the at least one channel, recess, or void internally forms the at least one conduit.

20. The electrical circuit as defined in claim 1, wherein the heat sink comprises fins.

21. The electrical circuit as defined in claim 1, wherein the electrical component comprises the at least one fluid conduit.

22. The electrical circuit as defined in claim 1, wherein the electrically conductive liquid in the at least one fluid conduit makes the electrical component functionally operational irrespective of cooling.

23. The electrical circuit as defined in claim 1, wherein at least one segment of the at least one fluid conduit has the physical shape or geometry needed to make the electrical component functionally operational.

24. The electrical circuit as defined in claim 1, wherein heat is transferred from the electrical component to the heat sink by circulation of the electrically conductive liquid.

* * * * *